(12) United States Patent
Ishida et al.

(10) Patent No.: US 8,792,143 B2
(45) Date of Patent: Jul. 29, 2014

(54) OPERATION DEVICE AND IMAGE READING APPARATUS WITH A TOUCH PANEL

(75) Inventors: Yasushi Ishida, Tokyo (JP); Hiroshi Ogushi, Shiroi (JP); Noboru Shimoyama, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 688 days.

(21) Appl. No.: 13/074,447

(22) Filed: Mar. 29, 2011

(65) Prior Publication Data

US 2011/0299129 A1    Dec. 8, 2011

(30) Foreign Application Priority Data

Jun. 8, 2010 (JP) .................. 2010-131252

(51) Int. Cl.
*H04N 1/32* (2006.01)
(52) U.S. Cl.
USPC ............................. 358/442; 345/173
(58) Field of Classification Search
USPC .......... 358/400, 401, 443, 296, 305; 345/173, 345/174
See application file for complete search history.

(56) References Cited

U.S. PATENT DOCUMENTS

| 8,537,132 B2* | 9/2013 | Ng et al. ................ 345/173 |
| 2009/0033636 A1 | 2/2009 | Toyota et al. |

FOREIGN PATENT DOCUMENTS

| JP | 11-283425 A | 10/1999 |
| JP | 2009-88759 A | 4/2009 |

* cited by examiner

*Primary Examiner* — Thomas D Lee
(74) *Attorney, Agent, or Firm* — Canon USA Inc. IP Division

(57) ABSTRACT

A touch panel includes a ring-like shaped light-transmissive portion. A ring-shaped diffusion surface is formed on the bottom surface of a light guide element. The ring-like shape includes a second region provided at a location corresponding to two light sources adjacent to a first region corresponding to one light source. A distance from a location of the ring-shaped light-transmissive portion to a periphery of the ring close to the light source is greater in the second region than in the first region. Light emitted from the light source and incident to the light guide element is diffusion-reflected on the diffusion surface and a part of the diffusion-reflected light illuminates the light-transmissive portion.

11 Claims, 6 Drawing Sheets

OPERATION DEVICE AND IMAGE READING APPARATUS WITH A TOUCH PANEL

BACKGROUND OF THE INVENTION

1. Field of the Invention

The present invention generally relates imaging and, more particularly, to an operation device including a touch switch and an image processing apparatus including the operation device.

2. Description of the Related Art

Japanese Patent Application Laid-Open No. 2009-88759 discusses a multifunction peripheral (MFP) which includes an image reading unit. The device includes a reading unit, which is configured to read an image of a document set on a document reading surface, and a pressing plate, which can open on the document reading surface. On a top surface of the pressing plate, an operation unit, which includes a plurality of input keys, and a display device, such as a liquid crystal display (LCD) panel, are provided.

U.S. Patent Application Publication No. 2009/0033636 A1 discusses a capacitive touch panel input device. The capacitive touch panel input device includes a substrate and a spacer. A plurality of sensor electrodes is implemented on the capacitive touch panel input device. The spacer is set on each sensor electrode.

Japanese Patent Application Laid-Open No. 11-283425 discusses an illumination device (a backlight), which illuminates an LCD display device that displays a character and a graphic with light from the back thereof. Another conventional method discussed in the Japanese Patent Application Laid-Open No. 2009-88759 includes an operation unit that has a structure of a mechanical-contact key, such as a tactile switch. However, in terms of lower costs and appropriate component arrangement and design, the operation unit can be replaced with the capacitance touch switch, such as the one discussed in the U.S. Patent Application Publication No. US 2009/0033636.

In this case, the visibility of the switch can be increased by using a backlight (an illumination device) provided behind the switch. In addition, in this case, the operability of the capacitive touch panel input device also can be increased by turning off the backlight if it is not necessary to use the backlight.

The above-described structure of the conventional operation unit may not be implemented if uneven luminosity occurs and if a large number of light sources are required. In other words, in order to implement the above-described structure of the conventional operation unit, if the area of a region of the touch switch to be illuminated with light is large, it is required to illuminate the touch switch from behind with light intense enough to increase the visibility of the touch switch to a highly visible level and to reduce uneven luminosity with the smallest possible number of light sources.

The illumination device discussed in Japanese Patent Application Laid-Open No. 11-283425 forms a reflection surface in a region of a light guide plate 8 (FIG. 1B) having a limited area to illuminate the touch switch with highly intense light. In addition, an exit window 11 (FIG. 1A), which has a white cover frame, is provided limitedly for the display range to prevent leaking light. However, in order to illuminate the necessary range of a large area with light by using the smallest possible number of light sources, the structure of the operation unit discussed in Japanese Patent Application Laid-Open No. 11-283425 may not be useful enough.

For example, if the operation unit is a ring-shaped large input device, such as a jog wheel, and if the input device is to be illuminated with light in a ring-like shape, the distance from the light source may differ for different locations on the ring-like shape. Accordingly, a remarkable difference in the brightness for different locations on the ring-like shape may arise. Therefore, it becomes difficult to uniformly illuminate the entire device with highly bright light.

In order to reduce unevenness of brightness, it is necessary to provide a multiple of light sources along the ring-like shape. Accordingly, the arrangement of the light sources or the device itself may be restricted. In addition, the costs of manufacture may increase.

Furthermore, it may be difficult to apply the illumination device discussed in Japanese Patent Application Laid-Open No. 11-283425 as a backlight for illuminating the capacitance touch switch discussed in the U.S. Patent Application Publication No. 2009/0033636 A1 with light because of the following reason.

More specifically, if the structure discussed in the U.S. Patent Application Publication No. 2009/0033636 A1 is employed, air gap may arise in or around the exit window 11. If air gap exists between the surface of a touch panel, which is touched by an operator with his finger, and an electrode, it may become difficult to detect the capacitance.

Accordingly, if an electrode is provided in the structure discussed in the U.S. Patent Application Publication No. 2009/0033636 A1, it is required to provide the electrode outside the exit window 11 (i.e., on the back side of an LCD display device 12. Therefore, the electrode may interfere with the light emitted from the backlight and may overlap on the display. Accordingly, in this case, the display may not be appropriately executed.

SUMMARY OF THE INVENTION

The present invention is directed to an apparatus capable of illuminating a large illumination target region having a ring-like shape, such as a ring-shaped touch switch, from behind and with unevenness of brightness suppressed to a minimum, and with as small a number of light sources as possible.

According to an aspect of the present invention, an operation device includes a panel including a light-transmissive portion having a ring-like shape, a light guide element having a first surface and a second surface, the first surface facing the panel, a plurality of light sources provided at a plurality of locations around the light guide element, and a plurality of electrodes provided at locations corresponding to the light-transmissive portion closer to the second surface of the light guide element and configured to detect a capacitance, The light guide element has a diffusion surface having a ring-like shape and is formed on the second surface. The ring-like shape of the diffusion surface includes a first region corresponding to one of the light sources and a second region provided between two of the light sources adjacent to each other. A distance from a location of the ring-shaped light-transmissive portion to a periphery of the ring close to the light source is greater in the second region than in the first region. Light emitted from the light source and incident to the light guide element is diffusion-reflected on the diffusion surface and a part of the diffusion-reflected light illuminates the light-transmissive portion.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the present invention.

DESCRIPTION OF THE EMBODIMENTS

Various exemplary embodiments, features, and aspects of the invention will be described in detail below with reference to the drawings.

In the present specification, apparatuses which have an image reading unit configured to read an image of a document, such as a scanner, a printer, a facsimile apparatus, a copying machine, or a multifunction peripheral (MFP), will be collectively referred to as an "image reading apparatus".

Figure 1A:
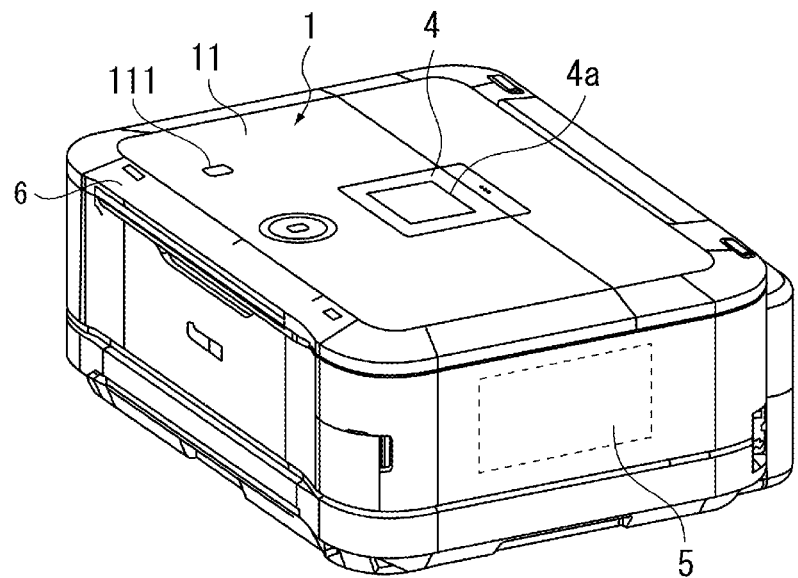
FIGS. 1A and 1B are perspective views each illustrating an exemplary configuration of an apparatuses according to an exemplary embodiment of the present invention.
Figure 1B:
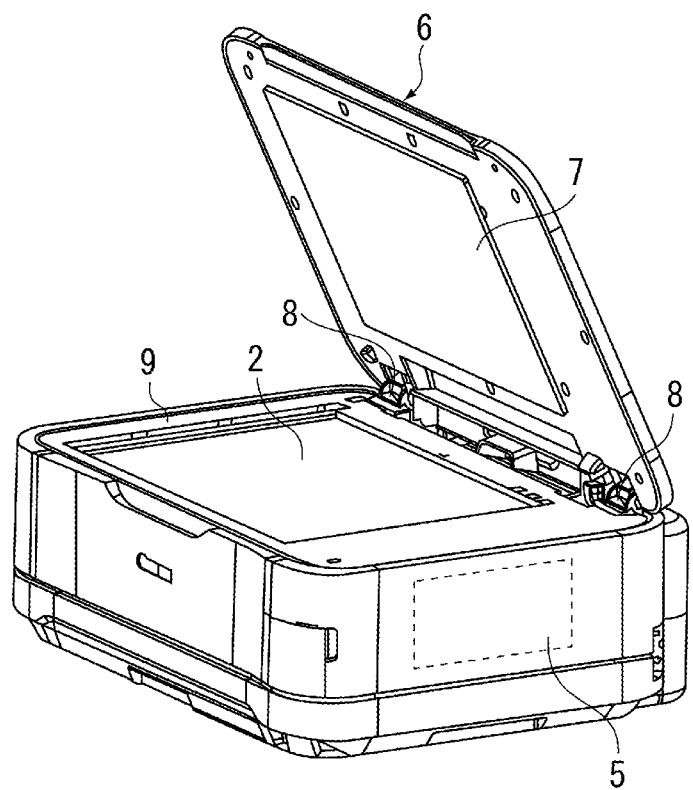

FIGS. 1A and 1B illustrate an exemplary configuration of an image reading apparatus according to an exemplary embodiment of the present invention. FIG. 1A illustrates a state of the image reading apparatus in which a pressure plate thereof is closed while in FIG. 1B, the pressure plate is opened.

The image reading apparatus, within a housing thereof, includes a reading unit having a flatbed scanner, a recording unit, and a control unit 5. The recording unit reads an image of a document set on a document reading surface. The recording unit prints a document image read by reading the document on a sheet. The control unit 5 controls an operation of the entire image reading apparatus. The reading unit and the recording unit are implemented by a well-known art, such as the conventional device discussed in Japanese Patent Application Laid-Open No. 2009-88759. Accordingly, the reading unit and the recording unit will not be described in detail in the present invention.

The control unit 5 is constituted by a controller board, which includes a central processing unit (CPU), a memory, and various input/output (I/O) interfaces. A pressing plate 6 is provided at the top portion of the image reading apparatus and can open on a document reading surface 2.

After appropriately installing the image reading apparatus to a user (operator)'s environment, the operator can access the image reading apparatus from the left (the front side) of FIGS. 1A and 1B.

Referring to FIG. 1A, the pressing plate 6 is a document positioning plate cover, which presses the document when closed. A panel unit 1 is provided on the top surface of the pressing plate 6.

The panel unit 1 includes a panel cover 11. On the panel cover 11, a display unit 4 and various operation keys (input switches) are installed closely to one another. In addition, a power button 111 is installed to the panel cover 11. The operation keys are capacitance touch switches except the power button 111.

The capacitance touch switch is a touch switch that detects the capacitance, which varies when the operator touches its touch-operation surface with his/her finger, and recognizes the detected capacitance as an input. The detailed configuration of and an operation executed by the capacitance touch switch will be described in detail below.

The display unit 4 includes a display window 4a, which is constituted by a transparent member. When the display unit 4 is retracted, the display unit 4 is tilted just onto the surface of the panel cover 11, as illustrated in FIG. 1A. The display unit 4 can be pivoted by the operator to be tilted up to become oriented towards the front of the image reading apparatus as indicated by an arrow A in the drawing. In other words, when the display unit 4 is retracted (pivoted down), a display of the display window 4a can be viewed from above. On the other hand, when the display unit 4 is extended (pivoted up), the display of the display window 4a can be viewed from the front.

The power button 111 has a structure of a mechanical contact key, such as a tactile switch. If the operator presses the power button 111 when the image reading apparatus has been powered off, the apparatus is powered on. On the other hand, if the operator presses the power button 111 when the image reading apparatus has been powered on, the apparatus is powered off.

Referring to FIG. 1B, the pressing plate 6 is pivotably mounted to a frame 9 in a back portion (the opposite portion of the front portion thereof) at two locations by using hinges 8. The reading plate 2 is constituted by a transparent glass plate. The operator sets a document on the top surface of the reading plate 2 in a face-down state (i.e., with the surface of the document to be read facing downwards). The perimeter of the glass plate is covered with a cover to be mounted to the frame 9.

A press-contact sheet 7 is mounted to the inner (back) surface of the pressing plate 6 in order to prevent floating of the document set on the reading plate 2 by applying pressure onto the document. Vertical play is provided to engagement between the hinge 8 and the pressing plate 6. Accordingly, the image reading apparatus can read an image of a thick book document.

The control unit 5 controls various operations executed by the image reading apparatus. More specifically, the control unit 5 controls an operation of each of the reading unit and the recording unit. In addition, the control unit 5 controls the display by the display unit 4, a switch input that is input by an operation on the touch switch, and the display of the touch switch.

As will be described below, the control unit 5 controls a plurality of operation modes of the image reading apparatus. More specifically, the control unit 5 toggles on and off a backlight of the touch switch (i.e., light for illuminating the touch switch from behind) according to each selected operation mode.

Figure 2A:
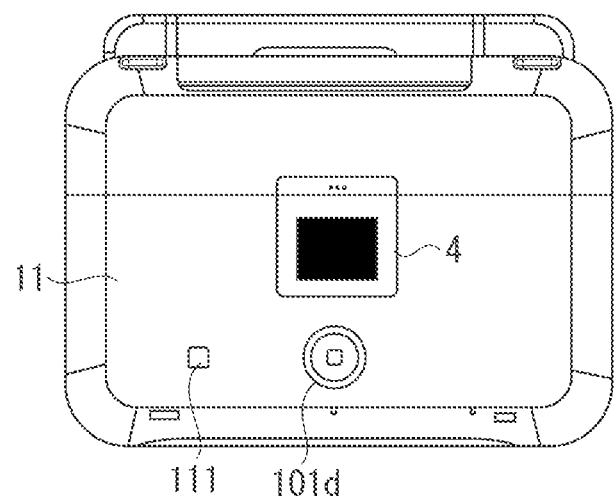
FIGS. 2A and 2B illustrate a state of a display on an operation panel in each of power-off and power-on states.
Figure 2B:
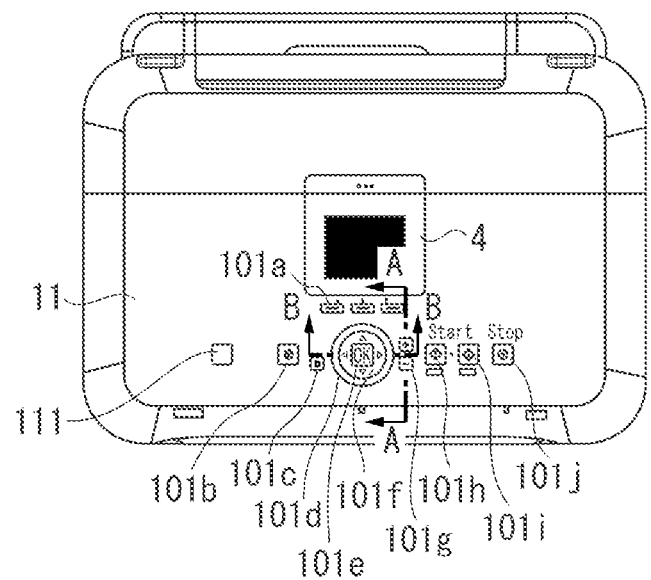

FIGS. 2A and 2B are top views of the image reading apparatus, which illustrate a status of display on an operation panel (operation device) provided to the top surface of the pressing plate 6 and to the panel cover 11, respectively.

In the example illustrated in FIG. 2A, the image reading apparatus has been powered off. Various operation keys of an operation unit of the image reading apparatus are out of view of the operator except the power button 111 and a jog wheel 101d.

In the example illustrated in FIG. 2B, the image reading apparatus has been powered on and all the operation keys are displayed in a lit state. When the key is displayed in a lit state, the operator can validly input information via the operation key displayed in the lit state.

In the example illustrated in FIG. 2B, the operation key includes a home key 101b, a return key 101c, which can be operated to a previous state, a monochromatic copy key 101h, a color copy key 101i, and a stop key 101j. The monochromatic copy key 101h is a key for instructing the start of a monochromatic copy operation or a monochromatic image scan operation. The color copy key 101i is a key for instructing the start of a color copy operation or a color image scan operation. The stop key 101j is a key for instructing the discontinuation of the current copy operation or scan operation.

In addition, the operation key includes a function key 101a. The function key 101a is constituted by three keys, which can be operated for selecting a display item displayed on a screen of the display unit 4. Furthermore, the operation key includes four-arrow (four-direction) key 101f and a jog wheel 101d. The four-direction key 101f can be operated to move a cursor up, down, left, or right on the screen displayed on the display unit 4. The jog wheel 101d has a wheel-like shape and can be operated to move the cursor.

The operation key includes an OK key 101e and plus-minus ("+" and "−") keys 101g. The OK key 101e can be operated to finally inputting an operator selection. The plus-minus keys 101g can be operated to set numerical values, such as the number of copies.

Each of the above-described operation keys is a capacitance touch switch, which includes a backlight. The backlight of each operation key can be independently turned on or off. When the backlight is turned on, a graphic (mark), which is uniquely assigned to the corresponding key, is displayed. Accordingly, the operator can easily recognize the operation key. On the other hand, when the backlight of the operation key is turned off, the mark on the key become hardly recognizable for the operator. Note that the meaning of "turned off" contains not only the backlight becoming off completely, but also becoming alight with a weak power.

Figure 3A:
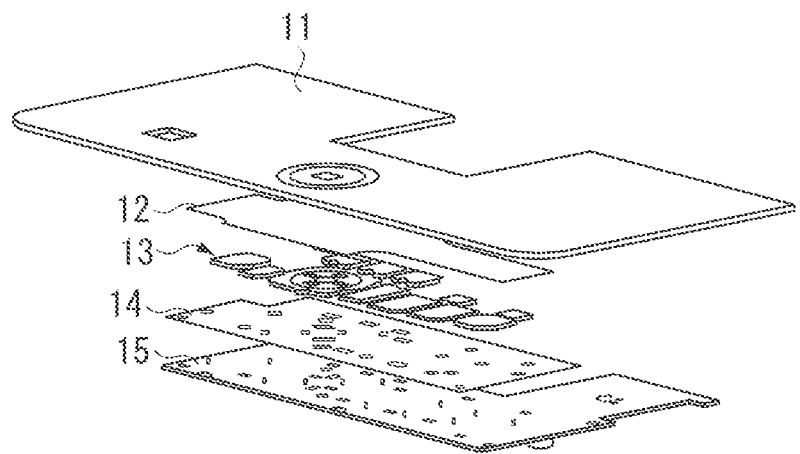
FIGS. 3A and 3B illustrate an exemplary structure of a panel unit.
Figure 3B:
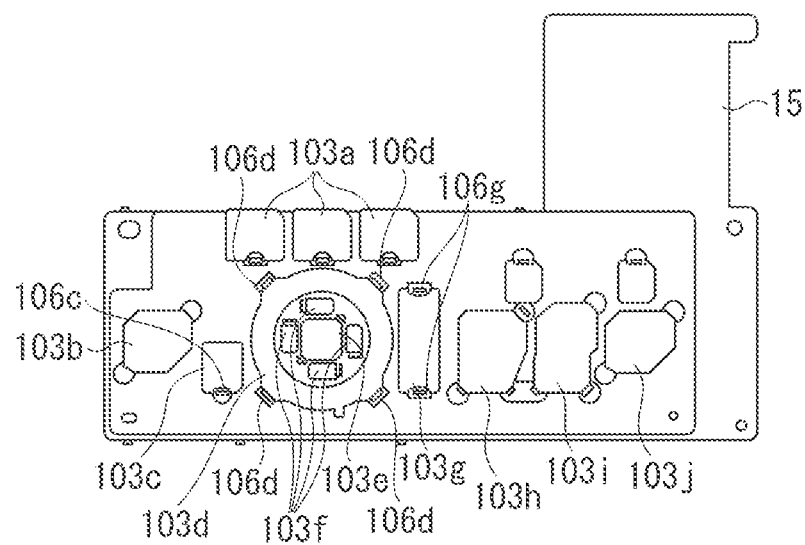

FIGS. 3A and 3B illustrate an exemplary configuration of the panel unit 1, respectively. More specifically, FIG. 3A is a decomposition perspective view of a laminated structure of the panel unit 1. FIG. 3B is a top view of the panel unit 1.

Referring to FIG. 3A, the panel unit 1 includes a five-layer laminated structure including, in order from the front (upper) surface to the back (bottom) surface, the panel cover 11, an elastic sheet 12, a light guide element group 13, an elastic sheet 14, and a circuit substrate 15. The panel unit 1, as a whole, is an integrated structural member, which is closely laminated together by using the elastic sheet 12 and the elastic sheet 14.

More specifically, the elastic sheet 12 (a first elastic sheet), which is a translucent sheet, is laminated between the panel cover 11 and the light guide element group 13 to closely attach the panel cover 11 and the light guide element group 13 together.

Similarly, the elastic sheet 14 (a second elastic sheet), which has a sheet-like shape, is inserted between the light guide element group 13 and the circuit substrate 15 to closely attach the light guide element group 13 and the circuit substrate 15 together. It is not necessary that the elastic sheet 14 is translucent. Both the elastic sheets 12 and 14 are made of a nonconductive insulating material.

The panel cover 11 is an integrated seamless board-like transmissive (transparent or translucent) member. The panel cover 11 is made of a plastic material, such as acryl, acrylonitrile butadiene styrene (ABS), polycarbonate (PC), methyl methacrylate-butadiene-styrene resin (MBS), or styrenic-block-copolymers (SBC), or a glass material.

Each of the elastic sheets 12 and 14 is one integrated (non-divided) sheet, which is commonly provided for a plurality of electrodes. Because each of the elastic sheets 12 and 14 is an integrated (non-divided) sheet, it becomes easy to assemble the operation panel.

In assembling the operation panel, the panel cover 11 and the light guide element group 13 should be completely closely attached together by laminating the elastic sheet 12 between them without any gap or space. This is because if the panel cover 11 and the light guide element group 13 are not completely closely attached together and if air gap of low conductivity may arise due to the loose attachment between them, variation of the capacitance may not be stably detected. As a result, the reliability of the capacitance touch switch may degrade.

Furthermore, in order to easily exchange the panel cover 11 in a maintenance operation, the elastic sheet 12 should be easily removable, even after they are once closely laminated, without any residual bond. In order to achieve the sufficiently close attachment properties and the highly easy removability of the elastic sheet 12 at the same time, the present invention uses a self-tack elastic sheet for the elastic sheet 12, which can be adhered without using a bond. For the elastic sheet described above, a gel sheet can be used.

The elastic sheet 14, which is used for closely attaching the light guide element group 13 and the circuit substrate 15 (on the surfaces of the plurality of electrodes) together, has the same characteristic as that of the elastic sheet 12. Accordingly, for the elastic sheet 14, the self-tacking elastic sheet, such as a gel sheet, can be used.

It is not always necessary that both the elastic sheets 12 and 14 are gel sheets. In other words, either one of the elastic sheets 12 and 14 only can be a gel sheet. In addition, a sheet which is different from a gel sheet and made of a material having the same self-tacking properties and elasticity can be used as the elastic sheets 12 and 14. Furthermore, a two-sided adhesive tape that cannot be easily damaged when removed, such as a two-sided adhesive tape made by using polyethylene terephthalate (PTE), can be used.

FIG. 3B illustrates an exemplary arrangement of light guide elements, which are included in the light guide element group 13 and arranged on the circuit substrate 15.

Referring to FIG. 3B, the light guide element group 13 includes light guide elements 103a through 103j, which are arranged at locations corresponding to touching locations of the capacitance touch switch. In addition, one or more light sources are installed on the circuit substrate 15 for each light guide element.

For example, the light guide element 103g and one light source 106g are provided to illuminate the return key 101c. Furthermore, the light guide element 103g and two light sources 106g are provided to illuminate the plus-minus ("+" and "−") key 101g. In addition, the light guide element 103d and four light sources 106d are provided to illuminate the jog wheel 101d.

Figure 4A:
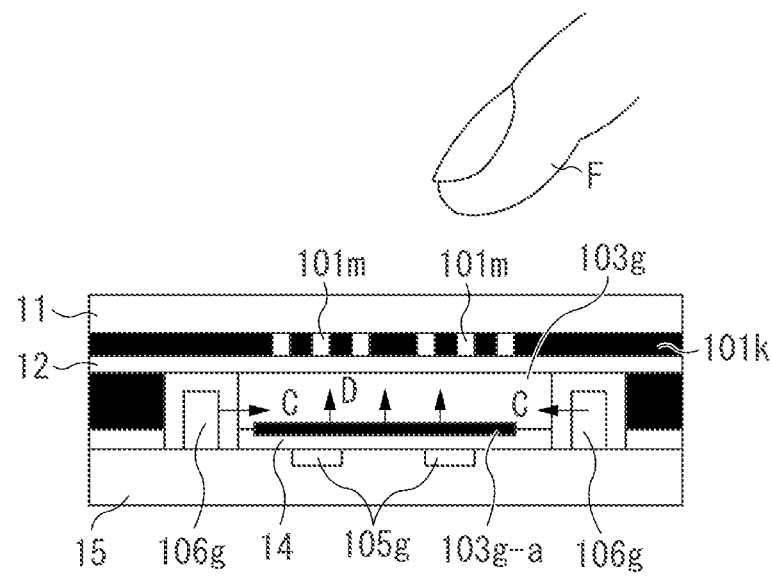
FIGS. 4A and 4B are cross sections of a capacitance touch switch.
Figure 4B:
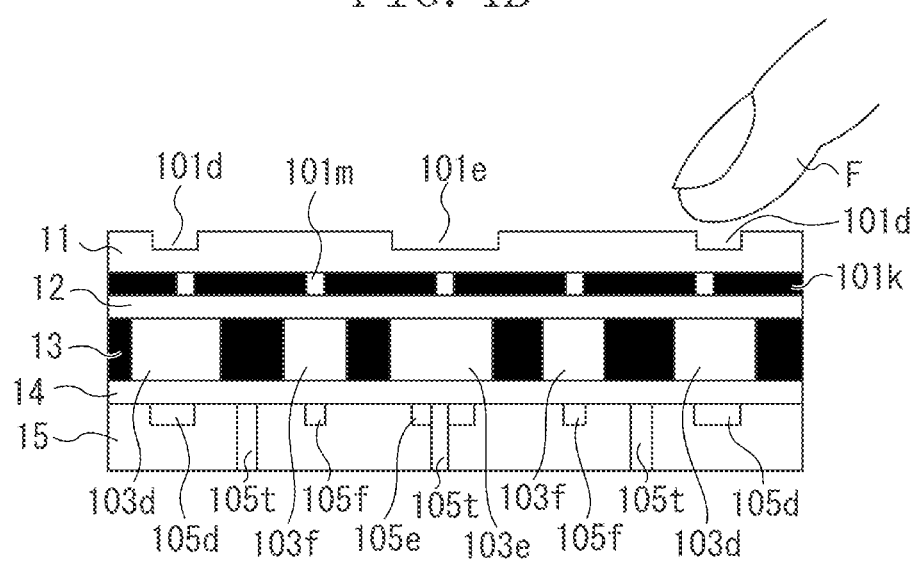

FIGS. 4A and 4B are cross sections of a capacitance touch switch. FIG. 4A is an A-A cross section of the plus-minus ("+" and "−") keys 101g illustrated in FIG. 2B.

On the surface of the panel cover 11 on its back side, a light-shielding layer 101k is formed by printing that uses a black ink. On the light-shielding layer 101k, a transmissive graphic portion 101m, which includes a light-transmissive portion that is partially not subjected to printing using the black ink, is formed.

Viewed from above, the transparent graphic portion 101m takes a specific graphical shape. In the example illustrated in FIGS. 4A and 4B, the transparent graphic portion 101m takes a shape of a graphic constituted by the symbols '+' and '−' surrounded by a rectangle as illustrated in FIG. 2B.

The panel cover 11 is translucent. Accordingly, if the transparent graphic portion 101m is illuminated with light by the backlight from behind (from the bottom), the graphical shape of the transparent graphic portion 101m can be recognized by the operator. If the backlight is turned off, the graphical shape of the transparent graphic portion 101m is not illuminated with light (i.e., turns completely dark to become less recognizable). Therefore, in this state, the operator cannot recognize the graphical shape of the transparent graphic portion 101m.

As a result of an experiment conducted by the inventor, by using the panel cover 11 made of a translucent gray-smoke material, it became very difficult for the operator to visually recognize the transparent graphic portion 101m when the backlight had been turned off. In this state, the graphical shape of the transparent graphic portion 101m was actually visually unrecognizable for the operator. Accordingly, the contrast between the graphical display on-state and the graphical display off-state became more intense.

The panel cover 11 is constituted by one integrated board-like member. Accordingly, if the backlight is turned off, the switches except the power button 111, the jog wheel 101d, and the OK key 101e become less recognizable. Accordingly, in this state, the operator would not be annoyed at which switch to operate. In addition, in this state, the beauty of the image reading apparatus can be increased.

The light source 106g, which is constituted by a semiconductor light source, is mounted onto the circuit substrate 15 at one location thereof. For the semiconductor light source, a light-emitting diode (LED) or an organic light emitting diode (OLED) can be used.

In the present invention, the light is emitted from the light source 106g in a direction horizontal to the surface of the operation panel and in a direction of incidence of light to the light guide element 103g via the side of the light guide element 103g.

When the light source 106g is turned on, a diffused light flux, which goes around a direction of an arrow C, is incident to the light guide element 103g. The diffused light flux that has been incident to the light guide element 103g is repeatedly reflected within the light guide element 103g to be further transmitted.

On the bottom surface of the light guide element 103g, a diffusion surface 103g-a is formed by applying white coating (white paint) thereon. After being incident on the diffusion surface 103g-a, the light is diffusion-reflected and a part thereof is diffused upwards (in a direction indicated by an arrow D).

A part of the diffused light is externally emitted out of the transparent graphic portion 101m. The other part of the diffused light is shielded by the light-shielding layer 101k. Accordingly, the symbols "+" and "−" become visually recognizable by the operator. As described above, the backlight is constituted by the light source and the light guide element.

At a location on the circuit substrate 15 immediately below a touching position, i.e., at a location corresponding to the diffusion surface 103g-a between two light sources 106g, two electrodes 105g are implemented to independently detect the status of touching on the "+" and "−" keys. In addition, a signal processing circuit (including a processor), which is electrically connected to each electrode, is installed on the circuit substrate 15.

The signal processing circuit converts the variation of the capacitance, which is detected at the electrode, into digital data. Furthermore, the signal processing circuit executes signal processing to determine the status of switching ("on" and "off" states (whether the touching surface has been touched)).

When the operator touches the panel cover 11, the region of the panel cover 11 touched by the operator by the fingertip F and the electrode 105g function as a kind of a condenser. Accordingly, when the operator touches the surface of the panel cover 11 with his fingertip F, the capacitance varies.

The signal processing circuit determines whether the panel cover 11 has been touched by the operator according to a result of detection of the variation of the capacitance by using the electrode 105g.

If an input via the touch switch has been previously enabled, the signal processing circuit determines that a switch input has been executed (that the switch has been set "on") if the capacitance detected by the electrode has exceeded a predetermined threshold value. On the other hand, if an input via the touch switch has been previously disabled, the signal processing circuit discards the capacitance detected by using the electrode or raises the above-described predetermined threshold value.

FIG. 4B is a B-B cross section of the capacitance touch switch at locations of the arrow key 101f, the jog wheel 101d, and the OK key 101e illustrated in FIG. 2B. On the front surface of the panel cover 11, a concave-like shaped dent is formed at a location thereof corresponding to the OK key 101e.

Similarly, for the jog wheel 101d, which has a ring-like shape, a concave ring-like shaped dent (groove) is formed. No dents or grooves are formed at locations corresponding to the other keys.

By providing a groove to a highly frequently used key, the operator is enabled to always execute correct operations according to a senses of touch and sight provided to the operator.

In particular, with respect to the jog wheel 101d, because the ring-shaped groove physically guides the motion of the operator's finger F, the operator is enabled to smoothly slide his finger on the touching surface along correct locations. Accordingly, the operability of the apparatus may become high.

A light guide element 103e is provided below the OK key 101e. Four light guide elements 103f are provided below the four arrow keys 101f, respectively. Below the jog wheel 101d, a ring-like shaped light guide element 103d is provided. Around the light guide element 103d, four light sources are provided. Below each light guide element, electrodes 105e, 105f, and 105d for detecting the status of switching are provided on the circuit substrate 15, respectively.

A through hole 105t is formed on the circuit substrate 15 at the location of the electrode. The air is released from the through hole 105t when attaching the light guide element group 13 and the circuit substrate 15 together by using the elastic sheet 14 on a large area. Accordingly, an air gap cannot easily arise between the elastic sheet 14 and the surface of the electrode.

As described above, the present invention employs the gel sheet having a high close-attachment properties as the elastic sheet 14. In addition, the present invention provides the through-hole to the circuit substrate 15. Due to a synergetic effect of these effects, no air gap can easily arise during assembly of the operation panel.

In the present exemplary embodiment, for the OK key 101e and the jog wheel 101d, the distance between the surface (touching surface) of the panel cover 11 and the corresponding electrode is shorter than the distance between the touching surface of the panel cover 11 and the arrow key 101f by the dimension corresponding to the depth of the concave groove. The variation of capacitance when touched by the operator may become greater as the above-described distance becomes shorter. Accordingly, the greater the distance is, the detection sensitivity may become higher.

If the operator has touched the touching surface at the boundary between adjacent keys, it is likely that the OK key 101e or the jog wheel 101d, whose detection sensitivity is high, may sense the touching operation by the operator. For the frequency of use as a switch, the OK key 101e and the jog wheel 101d have the greater frequency of use than that of the arrow key 101f. Accordingly, the design in which the key having a higher frequency of use is preferentially detects the operator's operation is highly rational and useful.

More specifically, the plurality of touch switches include mutually adjacent first switches (the OK key 101e and the jog wheel 101d) and a second switch (the arrow key 101f) having different detection sensitivity levels. The detection sensitivity of the first switch, which is more frequently used of the two, is higher than that of the second switch.

For the OK key 101e and the jog wheel 101d, the distance to the corresponding electrodes varies according to the location on the groove on the panel cover 11. Due to the variation in the distance to the corresponding electrode, the detection sensitivity of the capacitance switch can be different.

More specifically, for each of the OK key 101e and the jog wheel 101d, the groove implements two functions at the same time, i.e., a function for guiding the operator's finger and a function for adjusting the detection sensitivity. Accordingly, the present invention implements a high operability and reliability with a simple configuration.

Particularly for the jog wheel 101d, the location of the operator's finger may easily deviate from the intended position because the operator moves his finger along the ring-like shape. However, because the ring-shaped groove physically guides the motion of the operator's finger, it is made as unlikely as possible that the operator's finger goes off the intended position on the ring-shaped groove to touch the arrow key 101f.

Even if the operator's finger has gone off the intended position, the jog wheel 101d preferentially senses the touching operation due to the difference in the detection sensitivity. With the combination of the physical guidance of the operator's finger and the preferential order according to the difference in the detection sensitivity, of the present invention can implement a very high operability and reliability.

Now, an exemplary configuration of the light guide element 103d, which corresponds to the jog wheel 101d, will be described in detail below with reference to FIGS. 5A, 5B, 6A, and 6B. In the example illustrated in FIGS. 5A and 5B, a plurality of light sources are provided outside the ring-like shape.

Figure 5A:
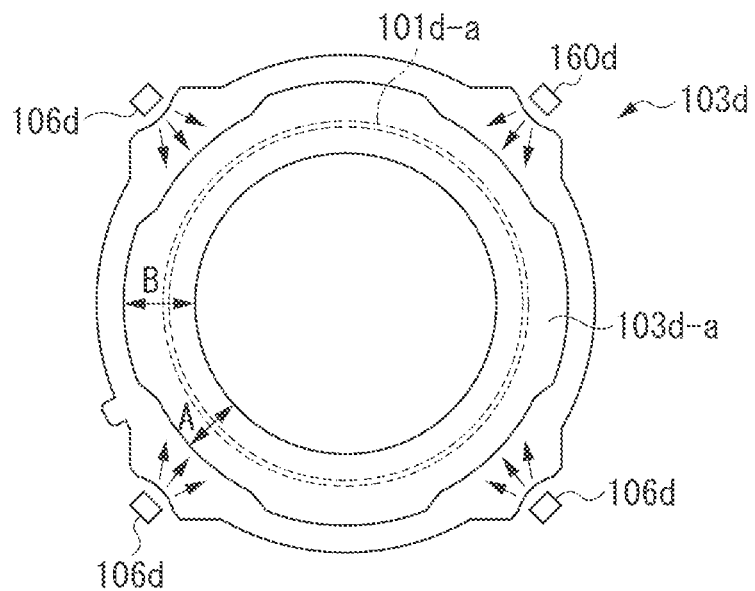
FIGS. 5A and 5B illustrate an exemplary structure of a light guide element.

FIG. 5A illustrates a first example of the light guide element. Referring to FIG. 5A, the light guide element 103d is made of a transparent glass or plastic material. Viewed from above, the light guide element 103d has a ring-like shape.

Around the outer periphery of the light guide element 103d having the ring-like shape, a light source 106d is provided at a plurality of (four) locations separated by an even angle of 90°. The light source 106d is a semiconductor light source, such as LED or OLED.

On a part (closer to the inner periphery) of the bottom surface of the light guide element 103d, a diffusion surface 103d-a having a ring-like shape is formed. The diffusion surface 103d-a is formed in a ring-like shape corresponding to the range at least including a ring-shaped light-transmissive portion 101d-a.

The diffusion surface 103d-a is formed by applying white coating on the surface of the light guide element by printing or by hand. The light incident to the diffusion surface 103d-a is diffusion-reflected by the minute projections and depressions on the surface of the paint.

When each light source 106d emits light, the light is incident to the light guide element 103d via the side thereof towards the inner periphery of the ring. The incident light is totally reflected on the top surface (a first surface) and the bottom surface (a second surface) of the light guide element in the region that does not include the diffusion surface 103d-a, to be guided towards the inner periphery of the ring with almost no loss of the light amount.

Of the guided light, the light incident to the diffusion surface 103d-a is diffusion-reflected on the diffusion surface 103d-a. A part of the light diffusion-reflected upwards illuminates the light-transmissive portion 101d-a of the jog wheel 101d to display the ring-shaped graphic.

The shape of the diffusion surface 103d-a will be described. The width of the ring of the ring-shaped diffusion surface 103d-a is not uniform all around. More specifically, the width of the ring is different for different locations.

To paraphrase this, in the first region close to the light source 106d, the ring has a width A. In a second region distant from the light source 106d (in the region between mutually adjacent light sources), the ring has a width B. The widths A and B has a relationship B>A.

In other words, the diffusion surface 103d-a has the ring-like shape having an uneven width. The ring-like shape includes a region whose width at a location whose distance from the light source is a second distance, which is greater than a first distance, compared to a width at a location whose distance from the light source is the first distance.

In the first region of the diffusion surface 103d-a, diffusion-reflected light having a sufficient light amount can be achieved. On the other hand, in the second region, which is provided between mutually adjacent light sources, the amount of light emitted from the light source decreases due to the great distance from the light source. Accordingly, the light amount of the diffusion-reflected may decrease.

In this state, the ring-shaped graphic display may be displayed with uneven brightness that may occur due to an alternate mixed existence of bright portion and dark portion along the circumference.

In order to prevent this problem, the present invention increases the width B of the ring in the second region compared to the width A in the first region to increase the area of the diffusion surface. Accordingly, the amount of the diffusion-reflected light becomes greater in the region distant from the light source. In the above-described manner, the present invention reduces uneven brightness that may occur in displaying the ring-like graphic.

In the exemplary embodiment of the present invention, the jog wheel 101d has a circular ring-like shape. Accordingly, the diffusion surface 103d-a has a circular ring-like shape according thereto. However, the shape of each of the jog wheel 101d and the light guide element 103d is not limited to this. In other words, the jog wheel 101d and the light guide element 103d can take the shape of a polygonal ring-like shape.

The shape of the jog wheel 101d and the diffusion surface 103d-a is not limited to a completely continued closed shape. In other words, the ring-like shape can include one or more breaks.

Figure 5B:
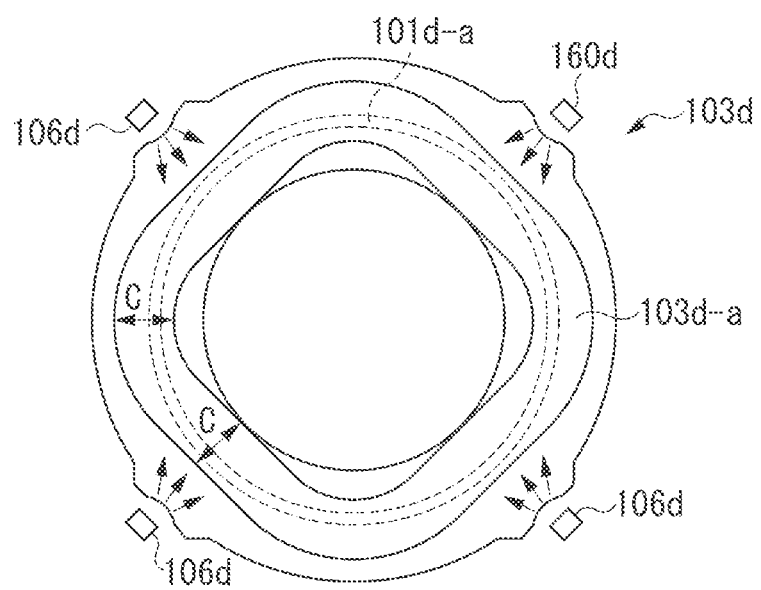

FIG. 5B illustrates a second example of the light guide element 103d.

In the example illustrated in FIG. 5B, differently from the example described above with reference to FIG. 5A, the width C of the ring-like shape of the diffusion surface 103d-a is substantially even all around. Furthermore, the ring-like shape has an irregular shape of a circle close to a rectangle, not the shape of a complete circle.

More specifically, the diffusion surface 103d-a having the ring-like shape deforms in the first region, which is close to the light source, towards the inner periphery of the ring (i.e., in the direction going away from the light source). In addition, in the second region, which is provided between adjacent light sources, the diffusion surface 103d-a having the ring-like shape deforms in the direction of the outer periphery of the ring.

Alternatively, the diffusion surface 103d-a can deform in either one of the first region and the second region and can take the regular shape in the other.

Figure 6A:
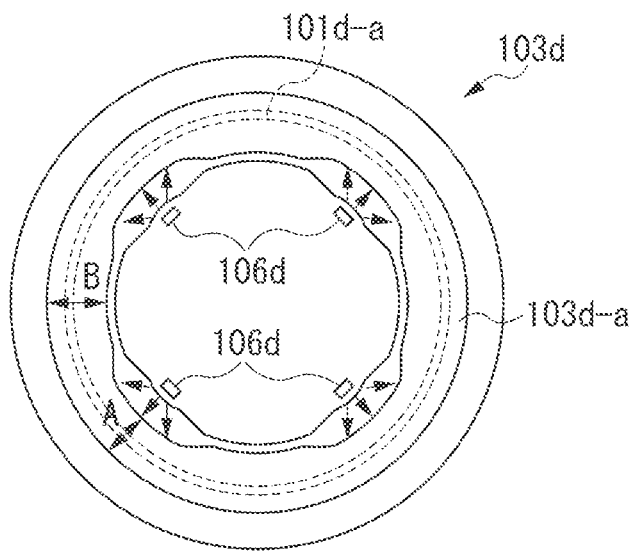
FIGS. 6A and 6B illustrate another exemplary structure of the light guide element.
Figure 6B:
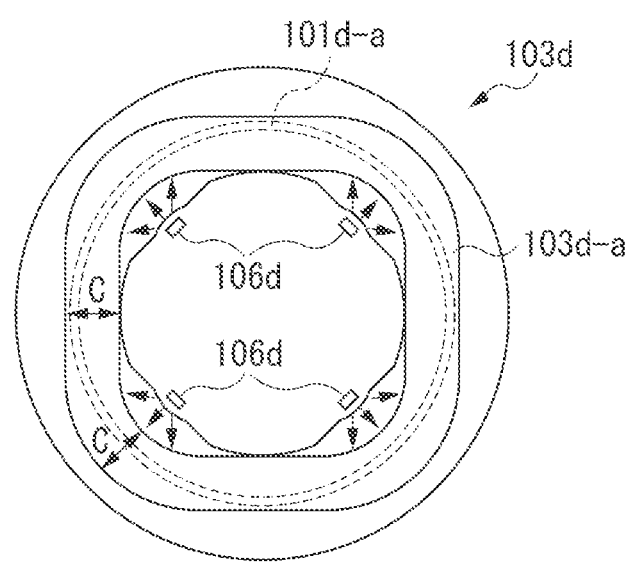

FIGS. 6A and 6B illustrates an example in which a plurality of light sources exists inside the ring. FIG. 6A illustrates an example corresponding to the example illustrated in FIG. 5A.

Around the inner periphery of the ring-shaped light guide element 103d, a light source 106d is provided at a plurality of (four) locations separated by an even angle of 90°. The light source 106d is a semiconductor light source, such as LED or OLED.

On a part (near the center in the direction of the radius) of the bottom surface of the light guide element 103d, a diffusion surface 103d-a having a ring-like shape is formed. The diffusion surface 103d-a is formed in a ring-like shape corresponding to the range at least including a ring-shaped light-transmissive portion 101d-a.

When each light source 106d emits light, the light is incident to the light guide element 103d via the side thereof towards the outer periphery of the ring, as indicated by an arrow in FIG. 6A.

The width of the ring of the ring-shaped diffusion surface 103d-a is not uniform all around. More specifically, the width of the ring is different for different locations. To paraphrase this, in the first region close to the light source 106d, the ring has a width A. In a second region distant from the light source 106d (in the region between mutually adjacent light sources), the ring has a width B. The widths A and B has a relationship B>A.

With the above-described configuration, the example illustrated in FIG. 6A can reduce uneven brightness that may occur in displaying the ring-like graphic as the example described above with reference to FIG. 5A.

FIG. 6B illustrates an example corresponding to the example illustrated in FIG. 5B.

In the example illustrated in FIG. 6B, the width C of the ring-like shape of the diffusion surface 103d-a is substantially even all around. In addition, the diffusion surface 103d-a deforms in the first region, which is close to the light source, towards the outer periphery of the ring (i.e., in the direction going away from the light source). Furthermore, in the second region, which is provided between adjacent light sources, the diffusion surface 103d-a having the ring-like shape deforms in the direction of the inner periphery of the ring.

Alternatively, the diffusion surface 103d-a can deform in either one of the first region and the second region and can take the regular shape in the other.

With the above-described configuration, the exemplary embodiment of the present invention can reduce uneven brightness that may occur in displaying the ring-shaped graphic as in the example described above with reference to FIG. 5B.

As described above, in both examples illustrated in FIGS. 5A and 5B and 6A and 6B, the ring-like shape of the diffusion surface 103d-a formed on the second surface of the light guide element 103d includes the second region, which is provided at a location corresponding to a location between two light sources 106d, which is adjacent to the first region corresponding to one light source 106d.

In addition, the distance from the location of the ring-shaped light-transmissive portion 101d-a to the periphery of the ring close to the light source is greater in the second region than in the first region.

The "periphery of the ring close to the light source" refers to the edge of the ring on the outer peripheral side if the light source 106d is on the outer peripheral side as illustrated in FIGS. 5A and 5B. On the other hand, if the light source 106d is on the inner peripheral side as illustrated in FIGS. 6A and 6B, the "periphery of the ring close to the light source" refers to the edge of the ring on the inner peripheral side. With the above-described configuration, the amount of diffusion-reflected light is greater in the second region than in the first region. Accordingly, the present invention can effectively reduce uneven brightness that may occur in displaying the ring-like graphic.

With the above-described configuration, if the area of the touch switch included in the jog wheel is large, the apparatus according to the present invention can illuminate the touch switch in the ring-like shape with highly bright backlight without any uneven brightness and with as small a number of light sources as possible.

In addition, the ring-like shaped groove is formed corresponding to the ring-shaped light-transmissive portion, which guides the operator's finger when touched, on the surface of the panel. Accordingly, the operator can feel a secure sense of operation.

In addition, the image reading apparatus of the present exemplary embodiment having the above-described configuration includes the operation panel having the capacitance touch switch on the top surface of the pressing plate.

Of the capacitance touch switch and a pressure-sensitive touch switch, the surface of the capacitance touch switch can be more firmly constructed. Accordingly, if the operator has pressed the switch on the switching surface of the switch in pressing the document by placing his hand on the pressure plate, the apparatus according to the exemplary embodiment of the present invention, which employs the capacitance touch switch as described above, can bear a very high pressure force.

Because the top surface of the pressure plate is an exposed surface, the operator may bump a foreign material thereon or may spill some liquid of a beverage thereon. The switching surface of the capacitance touch switch has a high resistance against such a local impactive force or spill of beverage than the pressure-sensitive switch.

If the backlight corresponding to a key via which an input can be validly executed only is lit, the operator who is not accustomed to operate the apparatus may not be annoyed for deciding which touch switch to operate.

In addition, when the operator presses a document against the pressing plate, if the backlight for the corresponding touch switch has been turned off, the operator can positively execute an operation via the operation panel because the switch is appropriately invisible in this case.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-131252 filed Jun. 8, 2010, which is hereby incorporated by reference herein in its entirety.

What is claimed is:

1. An operation device comprising:
    a panel including a light-transmissive portion having a ring-like shape;
    a light guide element having a first surface and a second surface, the first surface facing the panel;
    a plurality of light sources provided at locations around the light guide element; and
    a plurality of electrodes provided at locations corresponding to the light-transmissive portion closer to the second surface of the light guide element and configured to detect a capacitance,
    wherein the light guide element has a diffusion surface having a ring-like shape formed on the second surface,
    wherein the ring-like shape of the diffusion surface includes a first region corresponding to one of the light sources and a second region provided between two of the light sources adjacent to each other,
    wherein a distance from a location of the light-transmissive portion to a periphery of the ring-like shape of the diffusion surface close to the light source is greater in the second region than in the first region, and
    wherein light emitted from the light source and incident to the light guide element is diffusion-reflected on the diffusion surface and a part of the diffusion-reflected light illuminates the light-transmissive portion.

2. The operation device according to claim 1, wherein a width of the ring-like shape of the diffusion surface is wider in the second region than in the first region.

3. The operation device according to claim 1, wherein the ring-like shape of the diffusion surface deforms towards an inner periphery in the first region and/or deforms towards an outer periphery in the second region.

4. The operation device according to claim 1,
    wherein the light guide element has a ring-like shape, and
    wherein the light sources are provided at a plurality of locations around the outer periphery of the light guide element by an even angle.

5. The operation device according to claim 1,
    wherein the light guide element has a ring-like shape, and
    wherein the light sources are provided at a plurality of locations along the inner periphery of the light guide element by an even angle.

6. The operation device according to claim 1, wherein the ring-like shape of the diffusion surface has one or more breaks at specific locations on the ring.

7. The operation device according to claim 1, wherein a ring-shaped groove is formed, which is configured to guide a tip of an operator's finger touching a touching surface, which corresponds to the ring-shaped light-transmissive portion.

8. The operation device according to claim 1, wherein the first surface of the panel and the light guide element are in close contact with each other and the second surface of the light guide element and the electrode are in close contact with each other.

9. The operation device according to claim 1,
    wherein the panel and the first surface of the light guide element closely contact with each other with a first elastic sheet having translucency and non-conductivity, and
    wherein the second surface of the light guide element and the electrode closely contact with each other with a second elastic sheet having translucency and non-conductivity.

10. An image reading apparatus comprising:
    a reading unit configured to read an image of a document set on a reading surface;
    a pressing plate capable of opening from the reading surface; and
    the operation device according to claim 1, which is provided on a top surface of the pressing plate.

11. An illumination device comprising:
    a panel including a light-transmissive portion having a ring-like shape;
    a light guide element having a first surface and a second surface, the first surface facing the panel; and
    a plurality of light sources provided at locations around the light guide element,
    wherein the light guide element has a diffusion surface having a ring-like shape formed on the second surface,
    wherein the ring-like shape of the diffusion surface includes a first region corresponding to one of the light sources and a second region provided between two of the light sources adjacent to each other,
    wherein a distance from a location of the light-transmissive portion to a periphery of the ring-like shape of the diffusion surface close to the light source is greater in the second region than in the first region, and
    wherein light emitted from the light source and incident to the light guide element is diffusion-reflected on the diffusion surface and a part of the diffusion-reflected light illuminates the light-transmissive portion.

* * * * *